United States Patent [19]

Jongenburger

[11] Patent Number: 4,743,309
[45] Date of Patent: May 10, 1988

[54] METHOD FOR ZONE HEAT TREATMENT OF A METALLIC WORKPIECE

[75] Inventor: Peter Jongenburger, Baden, Switzerland

[73] Assignee: BBC Brown, Boveri & Company, Limited, Baden, Switzerland

[21] Appl. No.: 941,794

[22] Filed: Dec. 15, 1986

[30] Foreign Application Priority Data

Dec. 19, 1985 [CH] Switzerland ............... 5427/85

[51] Int. Cl.$^4$ ................................. C21D 1/00
[52] U.S. Cl. ............................. 148/13.1; 148/154
[58] Field of Search ............... 148/150, 145, 148, 149, 148/13, 13.1, 154, 11.5 N, 12.7 N, 162, 404

[56] References Cited

U.S. PATENT DOCUMENTS

| | | | |
|---|---|---|---|
| 3,746,581 | 7/1973 | Carins et al. | 148/11.5 F |
| 3,975,219 | 8/1976 | Allen et al. | 148/11.5 P |
| 4,583,608 | 4/1986 | Field et al. | 148/1 |

FOREIGN PATENT DOCUMENTS

158844 10/1985 European Pat. Off. .

*Primary Examiner*—Christopher W. Brody
*Attorney, Agent, or Firm*—Oblon, Fisher, Spivak, McClelland & Maier

[57] ABSTRACT

A method for zone heat treatment of metallic workpiece with a comparatively large cross-section, in which the workpiece is successively passed through a zone of higher temperature in such a way that the temperature of the workpiece initially rises steeply as a function of the displacement in the feed direction, passes through a flat maximum and then falls with a small slope. The method is carried out by passing the workpiece through a heating device equipped with a heating coil and a subsequent insulation body, or alternatively through a furnace. In a special embodiment of the method for obtaining the highest possible temperature gradient, the workpiece is drawn from a water bath and then passed through the heating coil.

5 Claims, 2 Drawing Sheets

METHOD FOR ZONE HEAT TREATMENT OF A METALLIC WORKPIECE

BACKGROUND OF THE INVENTION

1. Field of the Invention

The invention is based on a method for zone heat treatment of a metallic workpiece.

2. Discussion of Background

Workpieces are zone heat-treated in order to obtain certain crystal structures orientated in a preferred direction. In this heat treatment, the workpiece with a clearly defined longitudinal axis, in which longitudinally oriented columnar crystals are to be generated, is usually displaced along the longitudinal axis relative to a heat source. Fundamentally, it is possible to distinguish between three different conventional types of zone heat treatment methods:

(A) Feeding the workpiece through an induction coil (inductive heating); this produces a large temperature gradient in the longitudinal direction. The temperature/feed diagram has a curve shape with steep flanks before and after the induction coil and a narrow, sharp maximum at their apex (see DE-A-No. 2 219 275).

(B) Passing the workpiece through a furnace with a length large in comparison with the transverse dimension of the workpiece; this causes a comparatively small temperature gradient in the longitudinal direction. The temperature/feed diagram has a curve shape with flat flanks at the inlet and outlet from the furnace and a flat wide maximum between them (see Cairns et al., Met. Trans. A 6A, 1975, 179).

(C) Vertical immersion of the workpiece in a salt bath; this causes a single-side temperature gradient on the inlet side. The temperature/feed diagram has a curve shape with a medium slope which flattens out, followed by an approximately horizontal part at the maximum workpiece temperature.

The methods mentioned above are generally only suitable for small workpieces with a cross-section of a few square centimeters. In the case of larger workpieces, the necessary temperature gradient in the longitudinal direction cannot be achieved and the feed velocities are too low for economic manufacture.

There is, therefore, a need for an improvement to these zone heat treatment processes.

SUMMARY OF THE INVENTION

Object of this invention is to provide a novel zone heat treatment method in which high temperatures in the core of the workpiece, high temperature gradients in the longitudinal direction on the heating side and high feed velocities can be achieved.

The above object, and others, are achieved by providing a novel method for zone heat treatment of a metallic workpiece, which has cross-section defining a profile radius of at least 10 mm, in which the workpiece is passed successively in a feed direction through a zone of higher temperature, wherein the process is carried out such that the temperature considered as a function of the displacement in the feed direction of the workpiece initially rises steeply, passes through a flat maximum and then falls with a small slope.

The fundamental idea consists in ensuring that the workpiece cross-section heats through rapidly—with the associated high temperature gradients in the longitudinal (feed) direction of the workpiece—by an appropriate application of heat sources and a deliberately controlled heat flux. This is achieved by rapid heating in the entry zone by means of an induction coil and conservation of the heat (heat retention) in a subsequent zone using heat insulation or additional heating by means of a furnace. By this means, the longitudinal heat flux in the feed direction after passing through the actual heating zone is avoided whereas the radial heat flux within the latter is increased.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
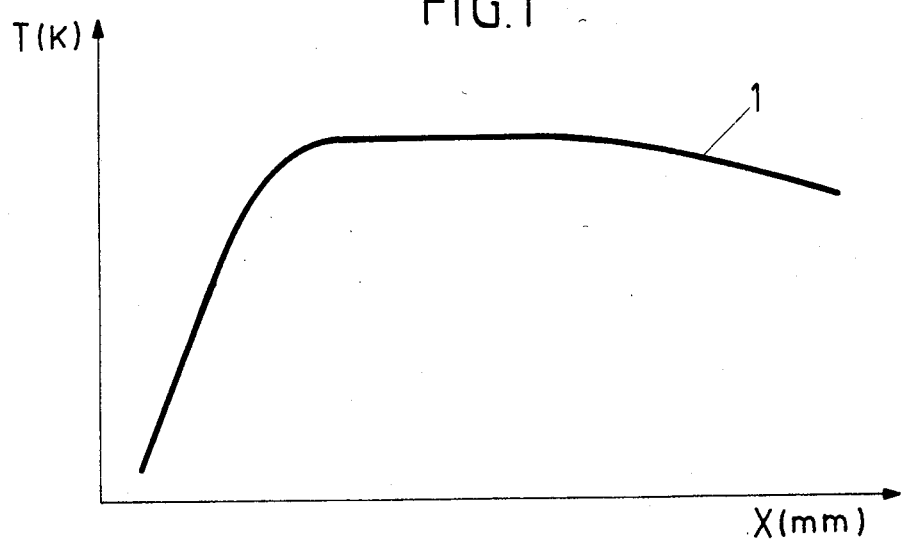
FIG. 1 is a graph illustrating a temperature/feed characteristic of the method.

Referring now to the drawings, wherein like reference numerals designate identical or corresponding parts throughout the several views, FIG. 1 shows a temperature/feed characteristic of the method of the invention. Reference numeral 1 refers to the temperature T as a function of the feed X (location function) in the longitudinal direction of the workpiece. The temperature initially rises steeply, continues into a flat, wide maximum and then falls again slightly. This temperature curve is of the greatest importance for achieving a longitudinally extended coarse grain.

Figure 2:
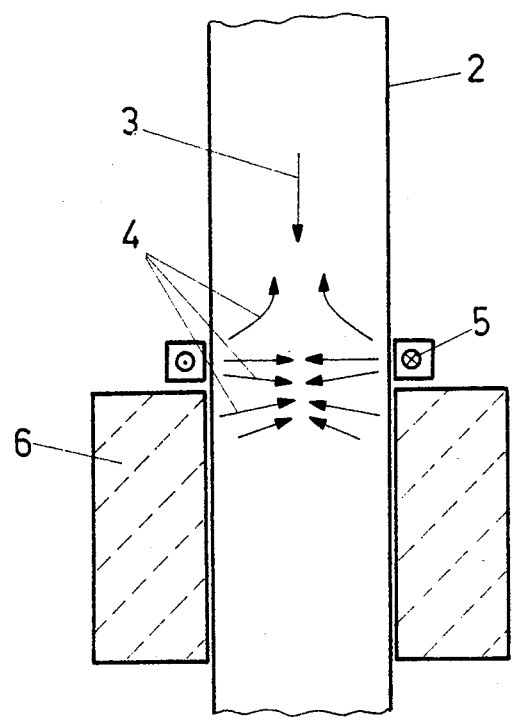
FIG. 2 is a cross-sectional view through a diagrammatic device with insulation body for carrying out the method of the invention

FIG. 2 is a cross-sectional view through a diagrammatic device with insulation body for carrying out the method. Reference numeral 2 refers to a workpiece (rod with circular, rectangular, polygonal, oval or any other cross-section, for example turbine blade), which is moved vertically downwards. Reference numeral 3 indicates the feed direction of the workpiece 2. The arrows 4 indicate the heat flux within the workpiece 2. Reference numeral 5 refers to a heating winding (induction coil) for concentrated inductive heating of the workpiece 2. Reference numeral 6 refers to an insulation body which limits the heat flux in the workpiece 2 in the transverse direction after passage through the hottest zone.

Figure 3:
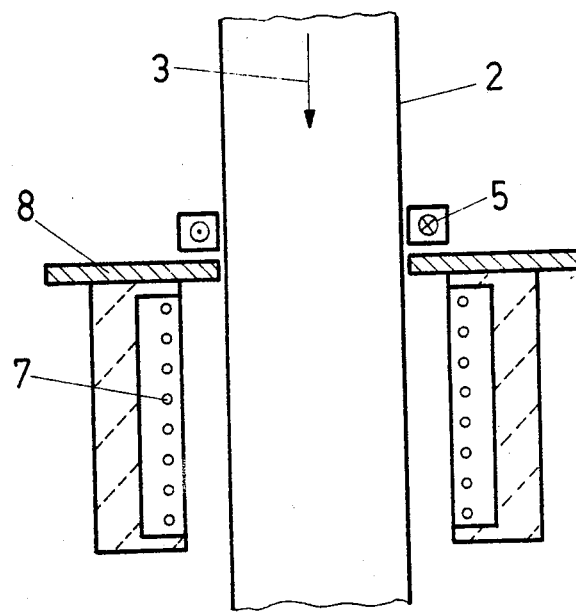
FIG. 3 is a cross-sectional view through a device including furnace for carrying out the method of the invention.

FIG. 3 is a cross-sectional view through a diagrammatic device with furnace for carrying out the method. Reference numeral 7 refers to a furnace, of any given type, which surrounds the workpiece 2 over its complete external shape; in the present case, it is shown, for example, as an electrical resistance furnace. Reference numeral 8 refers to a cover plate. The other reference numerals correspond precisely to those of FIG. 2.

Figure 4:
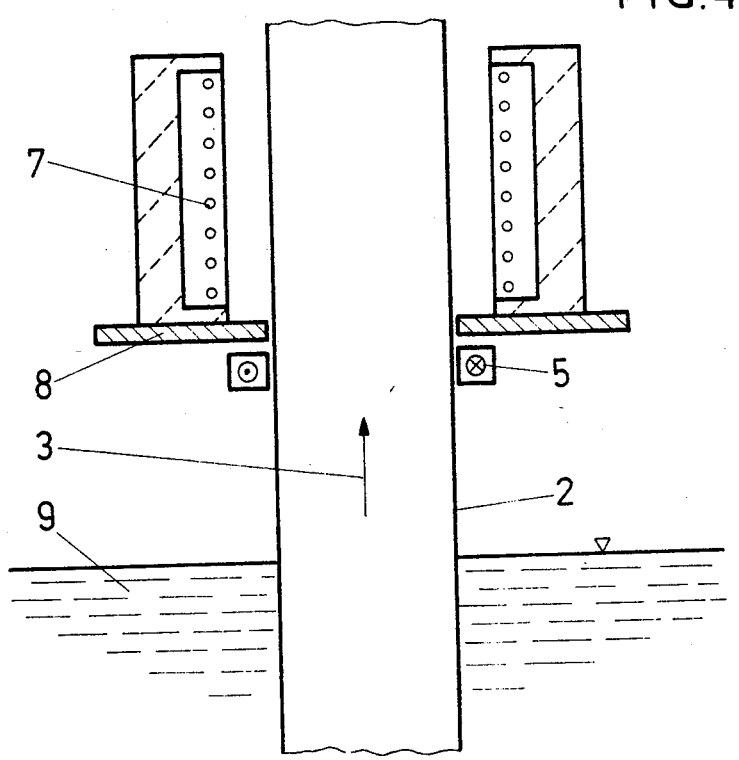
FIG. 4 is a cross-sectional view through a device including a water bath and a furnace for carrying out the method of the invention.

FIG. 4 is a cross-sectional view through a diagrammatic device with water bath and furnace for carrying out the method. In this case, the workpiece 2 is moved vertically upwards. Reference numeral 9 refers to a water bath. The other reference numerals are the same as in FIG. 3.

EMBODIMENT EXAMPLE 1

(See FIG. 1 and FIG. 3)

A longitudinally extended bar of a dispersion-hardened nickel base superalloy was zone heat treated. The material, with the commercial name MA 6000, had the following composition:
 Cr=15% by weight
 W=4% by weight
 Mo=2% by weight
 Al=4.5% by weight
 Ti=2.5% by weight
 Ta=2.0% by weight
 C=0.05% by weight
 B=0.01% by weight
 Zr=0.15% by weight
 $Y_2O_3$=1.1% by weight The bar had the following dimensions:
 Thickness=30 mm
 Width=150 mm (profile radius approx. 38 mm)
 Length=1000 mm The bar was heat treated in accordance with the diagram of FIG. 1 in a device similar to FIG. 3. For this purpose, it was lowered vertically into the device with a constant feed velocity of 4 mm/min. The furnace had a temperature of 1275° C. The heating rate in the center of the workpiece was approximately 43° C./min for a temperature of 1160° C. The temperature gradient in the center in the longitudinal direction reached a value of 10.6° C./mm.

After cooling, the grain structure was examined. The grains extended in the longitudinal direction had, on the average, a length of 20 mm, a width of 0.3 mm and a thickness of 0.3 mm.

EMBODIMENT EXAMPLE 2

(See FIG. 1 and FIG. 3)

A longitudinal round bar of 40 mm diameter and 500 mm length of the material with the commercial name MA 6000 and composition in accordance with Example 1 was zone heat-treated. The procedure was exactly the same as that given in Example 1. The constant vertical feed velocity was 8 mm/min, the furnace temperature 1270° C., the heating rate at 1160° C. approximately 80° C./min and the temperature gradient in the longitudinal direction approximately 10° C./mm.

EMBODIMENT EXAMPLE 3

(See FIG. 1 and FIG. 2)

A bar of the material MA 6000 with exactly the same composition and the same dimensions as those given in Example 1 was zone heat-treated. The insulation body 6 (FIG. 2) was present in place of the furnace 7 (FIG. 3). The feed velocity in the vertical direction was 6 mm/min, the heating rate for a temperature of 1160° C. was approximately 50° C./min and the temperature gradient in the longitudinal direction was approximately 8° C./mm.

The longitudinally extended coarse grain had, on the average, a length of 20 mm, a width of 0.3 mm and a thickness of 0.3 mm.

EMBODIMENT EXAMPLE 4

(See FIG. 1 and FIG. 4)

A longitudinally extended bar in a nickel-base superalloy manufactured by powder metallurgy was zone heat-treated. The material PM-IN 939 had the following composition:
 Al=3.7% by weight
 Co=19% by weight
 Cr=22.5% by weight
 Fe=0.5% by weight
 Ta=1.4% by weight
 Ti=5% by weight
 Zr=0.1% by weight
 Ni=Rest The dimensions were the same as in Example 1. The bar was heat-treated in accordance with the diagram of FIG. 1 in a device similar to FIG. 4. It was withdrawn vertically, with a constant feed velocity of 7 mm/min, out of the water bath at an average of 50° C. The furnace had a temperature of 1275° C. The heating rate for a temperature of 1000° C. was approximately 100° C./min, the temperature gradient in the longitudinal direction at 700° C. was approximately 25° C./mm and at 1150° C. approximately 10° C./mm.

The coarse grain had, on the average, a length of 23 mm, a width of 0.3 mm and a thickness of 0.3 mm.

The invention is not limited to the embodiment examples. The temperature/displacement gradient in the heating zone is preferably 7° to 20° C./mm, the flat maximum of the temperature in the temperature/location function has a width of between 80 to 400% measured relative to the average profile radius of the workpiece. The temperature/displacement gradient of the falling leg after passing through the temperature maximum advantageously exhibits a small slope of 0° to 1° C./mm in the workpiece. This part of the diagram can thus also be horizontal. The temperature of the furnace is preferably selected so that it is between 0° and 80° C. under the maximum temperature to which the workpiece is subjected.

$$\text{Profile radius} = \sqrt{\frac{\text{Cross-sectional area.}}{\pi}}$$

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of zone heat treatment of a metallic workpiece, which has a cross-section defining a profile radius of at least 10 mm, comprising:
 passing the workpiece successively in a feed direction through a zone of differing temperatures, including,
 a first passing step in which the workpiece is passed through a first temperature zone in which the temperature as a function of displacement of the workpiece in the feed direction initially rises steeply,
 a second passing step in which the workpiece is passed through a second temperature zone in which the temperature as a function of displacement of the workpiece in the feed direction passes through a flat maximum, and a third passing step in which the workpiece is passed through a third temperature zone in which the temperature as a function of displacement of the workpiece in the feed direction falls with a small slope.

2. The method as claimed in claim 1, wherein the temperature/displacement gradient in the workpiece as a function of the location in the first temperature zone is between 7° and 20° C./mm, wherein in the second temperature zone, the flat maximum of the temperature has a width of between 80 and 400% measured relative to the average profile radius of the workpiece, and wherein in the third temperature zone the temperature/displacement gradient of the workpiece is between 0° and 1° C./mm, where $$\text{Profile radius} = \sqrt{(\text{cross-sectional area})/\pi}$$

3. The method as claimed in claim 1, wherein in the first passing step the workpiece is passed through an inductive heating winding and immediately thereafter in said secondly passing step through a furnace whose temperature is between 0° and 80° C. under the maximum temperature to which the workpiece is subjected.

4. The method as claimed in claim 1, wherein in said first passing step the workpiece is passed through an inductive heating winding and immediately thereafter in said second passing step through a profiled hollow insulating body.

5. The method as claimed in claim 1, wherein prior to said first passing step the workpiece is passed through a cooling water bath and thereafter successively in said first passing step through an inductive heating winding and in said second passing step immediately thereafter through a furnace.

* * * * *